Sept. 15, 1970 I. R. A. CHRISTIE ET AL 3,528,893

VACUUM DEPOSITING AND ELECTRODEPOSITING METHOD OF FORMING A THERMOELECTRIC MODULE

Filed Nov. 17, 1967

INVENTORS

IAN ROBERT ARTHUR CHRISTIE

DEREK FRANK CASE

BY Young + Thompson

ATTYS.

United States Patent Office 3,528,893

Patented Sept. 15, 1970

3,528,893

VACUUM DEPOSITING AND ELECTRODEPOSITING METHOD OF FORMING A THERMOELECTRIC MODULE

Ian Robert Arthur Christie, Twickenham, and Derek Frank Case, Sunbury, England, assignors to United Kingdom Atomic Energy Authority, London, England, a British authority Filed Nov. 17, 1967, Ser. No. 684,029

Claims priority, application Great Britain, Nov. 22, 1966, 52,187/66

Int. Cl. C23b *5/50, 5/64*

U.S. Cl. 204—38 2 Claims

ABSTRACT OF THE DISCLOSURE

Contact strap formation for interconnecting the ends of pairs of thermoelectric members in an encapsulated thermoelectric power generator or refrigerator module which comprises three or more metal layers deposited one upon the other, the first lying adjacent the ends of the thermoelectric members being of a metal, such as gold, having the properties of good adherence and low contact resistance to and non-poisoning of the thermoelectric member materials, the second being of a metal, such as nickel, having the property of acting as a barrier against diffusion of the metal of the third, outwardly disposed, layer into the thermoelectric members and the third being of a metal, such as copper, which has high electrical conductivity. A fourth layer of a non-tarnishing metal may be deposited on the third layer.

This invention relates to thermoelectric devices and is more particularly concerned with improved forms of and methods for providing the necessary electrical connections or so-called contact straps between the ends of adjacent pairs of thermoelectric members of an encapsulated thermoelectric module suitable for use as a thermoelectric power generator or as a thermoelectric cooling device. The invention is of special interest in connection with devices which require to be used at elevated temperatures, for instance in the range of 250°–600° C. and with devices in which the thermoelectric members are of p- and n-type semiconductor material such as bismuth telluride, lead telluride, germanium telluride and other broadly equivalent alloy materials. The invention is particularly suitable for use in conjunction with the contact-strap formation methods described in copending patent application No. 662,943, filed Aug. 24, 1967.

The requirements for satisfactory contact strap formation, particularly when required for use at elevated operating temperatures, include (1) the use as a material for contact with both p- and n-type semi-conductor thermoelectric alloys of one which has good adhesion and low electrical contact resistance to such alloys, (2) the use as such contacting material of one which does not adversely affect the thermoelectric properties of either type of thermoelectric alloy if diffusion should occur at the elevated working temperature, (3) the use of a strap material having high electrical conductivity and low stress, (4) the use of a material which is capable of ready deposition to permit ease of manufacture, and (5) the use of a strap material which is relatively soft to facilitate subsequent lapping in the formation of the requisite flat module faces necessary to place these in good thermal transfer relationship with other parts of the thermoelectric device.

Copper is a suitable material to meet requirements (3), (4) and (5) above but has the disadvantage that it will rapidly poison most thermoelectric alloy materials by diffusion at elevated temperatures. The use of copper as a strap material demands the provision of a barrier layer between it and the thermoelectric materials.

For such a diffusion barrier, nickel is suitable from the aspect of requirement (2) above but it may not provide a sufficiently good adhesion to some thermoelectric materials under all conditions to meet requirement (1). Furthermore it is generally unsuitable when in the form of a thick strap due to difficulty in effecting deposition of sufficiently thick deposits as well as on account of its hardness and the relatively high stress characteristics of such deposits even when formed from nominally "low stress" electrolytic baths.

Gold, while normally meeting requirements (1) and (2) by providing excellent adhesion and low electrical contact resistance to thermoelectric materials and not materially affecting the properties of, at least, bismuth telluride type alloys at working temperatures in the region of 300° C., is difficult and costly to deposit in the form of a thick strap and is also ineffective if used as a thin diffusion barrier in conjunction with a superimposed copper build-up layer.

One object of the present invention is to overcome the difficulties arising from the particular characteristics of the different available materials by utilising a composite strap formation.

The method according to this invention of forming a contact strap electrically interconnecting the ends of a pair of thermoelectric members of a thermoelectric module comprises the steps of depositing directly onto the ends of said thermoelectric members and any intervening surface of electric insulating material, a first layer of a first metal, depositing upon said first layer a second layer of a second metal and then depositing upon said second layer a third layer of a third metal, said first metal being one which will adhere and have low electrical contact resistance to and will not react with or poison either of said thermoelectric members, said second metal being one which will act as a barrier against diffusion of said third metal into said thermoelectric members and said third metal being one of high electrical conductivity.

A thermoelectric module in accordance with this invention includes at least one pair of thermoelectric members whose adjacent ends are electrically interconnected by means of a contact strap which comprises a first layer of a first metal deposited directly on to the ends of said thermoelectric members and the surface of any intervening electric insulating material, a second layer of a second metal deposited upon said first layer and a third layer of a third metal deposited upon said second layer, said first metal being one which will adhere and have low electrical contact resistance to and will not react with or poison either of said thermoelectric members, said second metal being one which will act as a barrier against diffusion of said third metal into said thermoelectric members and said third metal being one of high electrical conductivity.

In order that the nature of the invention may be readily understood a number of embodiments thereof will now be described with reference to the accompanying drawing in which:

FIG. 1 is a fragmentary sectional view, drawn to enlarged scale, showing one form of contact strap according to the invention while.

In each of these figures the thickness dimensions of the different layers have been greatly magnified, in the interest of clarity, and are not to any proportionate scale.

Figure 1:
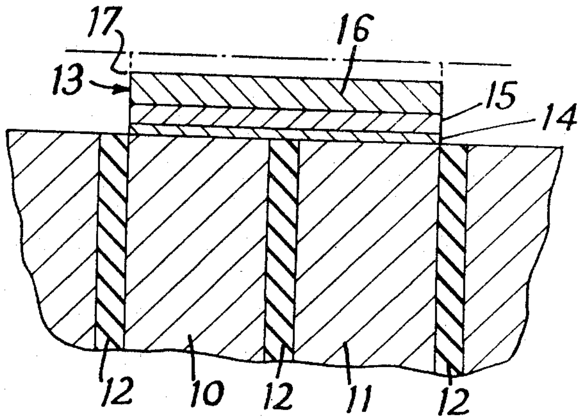

Referring first to the embodiment shown in FIG. 1, 10 indicates one thermoelectric member, e.g., of p-type semiconductor material, and 11 a second thermoelectric member, e.g., of n-type semi-conductor material. Such members form part of a thermoelectric power generator or refrigerator module and are held together in parallel side-by-side relation, along with other similar thermoelectric members by encapsulating electric insulating material 12.

The ends of the pair of members 11 are electrically connected by means of a contact strap, indicated generally at 13, which covers the end surfaces of each of the members 11, 12 and extends across the intervening surface of the encapsulating material 122 lying between the two members. Although only one pair of thermoelectric members and their interconnecting contact strap are shown it will be clear that a similar construction is normally provided for the linked ends of the remaining pairs of thermoelectric members of the module.

The contact strap 13 comprises a thin first layer 14 of gold of approximately 5000–10,000 A. thickness. This is deposited directly on to the thermoelectric alloy members 10, 11, preferably by vacuum evaporation. A second, diffusion barrier, layer 15 of nickel of approximately 0.0005″–0.002″ thickness is then deposited electrolytically under low stress conditions upon the first, gold, layer 14. A top layer 16 of copper of 0.005–0.010″ thickness is then deposited electrolytically on the second, nickel, layer 15.

The above composite strap construction is preferably effected with the aid of the method as described in the aforementioned co-pending patent application involving use of the insulating encapsulating material between the thermoelectric members in order to define the areas of the conductive straps. Alternatively suitable masking means, as indicated at 17, may be used to define the areas of the required discrete conducting straps coupling the adjacent ends of pairs of different thermoelectric elements of the module.

Figure 2:
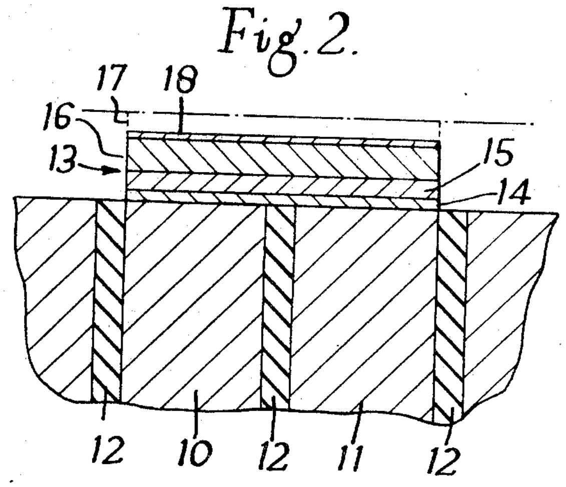
FIG. 2 is a fragmentary sectional view similar to FIG. 1 showing a modification.

FIG. 2 shows a modification in which a further thin layer or flash 18 of a suitable metal, such as nickel or gold, is deposited upon the outwardly facing surface of the copper layer 16 after the latter has been finished, e.g. by means of a lapping operation, in order to prevent tarnishing of the finished copper layer surface in oxidising atmospheres.

While gold is probably the most preferred metal for use in the formation of the first layer 14, alternative metals are silver, molybdenum, chromium, platinum, palladium and rhodium. Vacuum evaporation is the preferred method for effecting deposition of the first layer on account of the accompanying avoidance of any risk of chemical contamination, e.g. from any constituent of an electrolyte and since it will provide an electrically conductive layer over the intervening non-conducting areas of the encapsulating material 12 lying between the members 10, 11 which are to be connected. Other methods, such as electrolytic, electroless or chemical vapour deposition, may be used and with these it may be necessary to provide a conducting bridge across the intervening non-conducting areas of the encapsulating material. Such conducting bridges may be of electrically conductive cement, e.g. a ceramic medium or a glass binder in slurry or paste form loaded with a metal or a mixture of metals or graphite. Examples of such methods are described in our co-pending U.K. patent application No. 28,665/65.

For the second or diffusion barrier layer 15, alternative materials are silver, molybdenum, platium, palladium and rhodium. Deposition of this layer may be effected electrolytically or by other suitable methods such as flame- or plasma-spraying.

Alternatives to copper as the metal for the third, primarily electrically conductive, layer 16, are for example, silver or zinc. These may likewise be deposited by any suitable method such as electrolytically or by flame- or plasma-spraying.

We claim:

1. In a method of forming a contact strap electrically interconnecting the ends of a pair of thermoelectric members of a thermoelectric module that has electric insulating material between said ends and flush with said ends, the improvement comprising the steps of vacuum depositing directly on the ends of said thermoelectric members and said intervening electric insulating material a layer of gold between about 5,000 A. and 10,000 A. in thickness, electro-depositing on said gold layer a layer of nickel, and electro-depositing on said nickel layer a layer of copper.

2. A method as claimed in claim 1, in which said nickel layer has a thickness of about 0.0005 to 0.002 inch and said copper layer has a thickness of about 0.005 to 0.010 inch.

References Cited

UNITED STATES PATENTS

| | | | |
|---|---|---|---|
| 3,036,139 | 5/1962 | Feduska et al. | 136—236 |
| 3,082,277 | 3/1963 | Lane et al. | 136—237 |
| 3,208,835 | 9/1965 | Duncan et al. | 136—237 |
| 3,284,176 | 11/1966 | Reed et al. | 29—573 X |
| 3,306,784 | 2/1967 | Roes | 136—237 |

FOREIGN PATENTS

| | | |
|---|---|---|
| 211,206 | 11/1957 | Australia. |
| 744,482 | 10/1966 | Canada. |
| 587,490 | 4/1947 | Great Britain. |
| 938,453 | 10/1963 | Great Britain. |
| 192,262 | 8/1967 | U.S.S.R. |

OTHER REFERENCES

Horne, R. A., et al.: "RCA Technical Note No. 304," November 1959, 1 page.

WINSTON A. DOUGLAS, Primary Examiner

A. M. BEKELMAN, Assistant Examiner

U.S. Cl. X.R.

29—573; 136—237; 204—40